June 5, 1973

KAZUO MAEDA ET AL 3,737,340

METHOD OF MANUFACTURING SEMICONDUCTOR DEVICE WITH MULTILAYER WIRING STRUCTURE

Filed Dec. 23, 1970

2 Sheets-Sheet 2

United States Patent Office 3,737,340

Patented June 5, 1973

3,737,340

METHOD OF MANUFACTURING SEMICONDUCTOR DEVICE WITH MULTILAYER WIRING STRUCTURE

Kazuo Maeda, Kanagawa-ken, and Yasuo Sasaki, Kawasaki, Japan, assignors to Fujitsu Limited, Kawasaki, Japan Filed Dec. 23, 1970, Ser. No. 100,870
Claims priority, application Japan, Dec. 25, 1969, 44/451,690
Int. Cl. B44d *1/10, 1/18*
U.S. Cl. 117—212 8 Claims

ABSTRACT OF THE DISCLOSURE

A semiconductor device with multilayer wiring structure can be formed by the use of a mixed film the main constituents of which are a metal oxide and a silicon oxide are used for both wiring and insulation. A wiring layer in a multilayer wiring structure is formed by a conductive layer converted from a mixed film and is buried in the mixed film. The mixed film is formed by the gaseous phase decomposition of a metal complex and a silicon compound within an oxidizing atmosphere.

This invention relates to a method of manufacturing semiconductor devices with multilayer wiring structure and more particularly relates to a method of manufacturing semiconductor integrated circuits with multilayer wiring structure wherein at least a part of the wiring is buried in the insulating layer. This part of the wiring is formed by the reduction of a metal oxide, improving the reliability of the semiconductor device.

It is well known to perform multilayer wiring on a semiconductor substrate to facilitate the wiring and improve the density of integration of the semiconductor circuit element in the manufacture of a semiconductor integrated circuit and this multilayer wiring is based on the same concept as the multilayer printed circuit board. In a multilayer wiring, in general, siilcon dioxide formed by gaseous phase growth is used as the insulating material and aluminum is used as the wiring material as aluminum well adheres to silicon dioxide and has a high conductivity.

Figure 1:
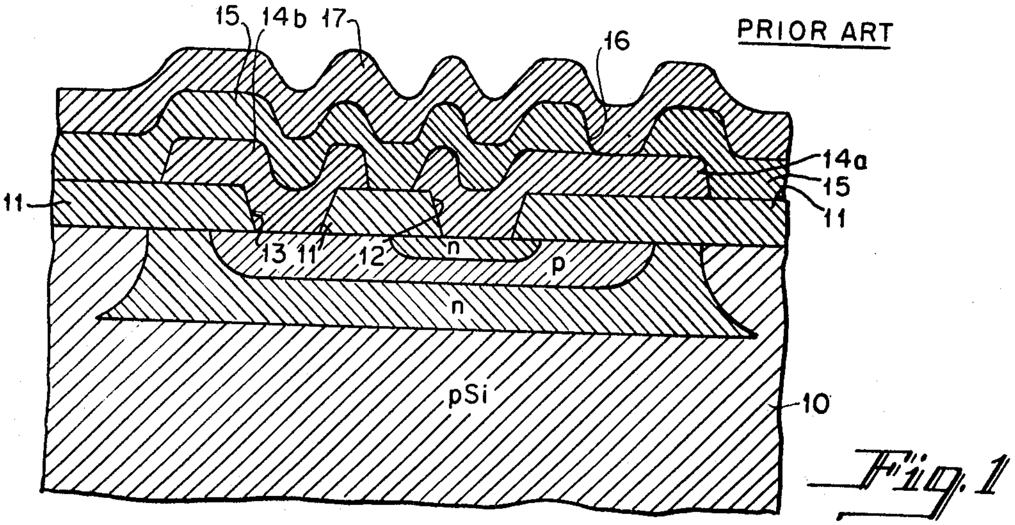
FIG. 1 is a sectional view of the conventional semiconductor device with multilayer wiring structure.

FIG. 1 shows a sectional view of a semiconductor device with multilayer wiring structure according to the prior art. A plurality of semiconductor circuit elements are formed on the surface of a silicon semiconductor substrate 10 by the known planar process. This surface is protected by an insulating film 11 such as silicon dioxide. Windows 12, 13 are opened in the portions of said insulating film 11 above the contact areas of said circuit elements, and a first wiring layer 14–*a* and 14–*b* of aluminum is formed. For the sake of simplicity, a single transistor is shown in the drawing as the semiconductor circuit element. Therefore, in this example, the contact areas are within the emitter region and the base region. The first wiring layer can be formed by depositing aluminum by evaporation on the entire surface of substrate 10 and then removing the unnecessary portion of aluminum by photo-etching process leaving the desired circuit pattern. The first wiring layer of aluminum has a thickness of about 10,000 A. After the formation of the first wiring layer, an insulating layer 15 such as silicon dioxide, is formed by the gaseous phase growth and an opening 16 is formed in the designated portion of the insulating layer 15 by the photo-etching process and a second wiring layer 17 is formed. The second wiring layer is electrically connected with the first wiring layer 14–*a* via opening 16. Insulating layer 15 has, also, a thickness of about 10,000 A.

Therefore, as evident from the drawing, the portion of insulating layer 15 above the edge portions of the underlying wiring 14–*a*, 14–*b* are made thin and this unevenness of insulating layer 15 results in the non-uniformity of the thickness of wiring 17. Opening 16 also causes wiring 17 to become considerably thin partly. For this reason, the conventional multilayer wiring structure has faults of short-circuiting and disconnection of the wiring. The reliability of the multilayer wiring structure is considerably low although the reliability of the manufacture of the semiconductor circuit element is high.

It is an object of this invention to provide a method of manufacturing semiconductor devices with multilayer wiring structure with little fault of disconnection and short-circuit.

Another object of this invention is to provide a method of manufacturing semiconductor devices with multilayer wiring structure capable of making the surface of the insulating layer extremely even.

Still another object of this invention is to provide a method of manufacturing semiconductor devices with multilayer wiring structure capable of electrically connecting the wiring in the upper layer with the wiring in the lower layer surely via a through opening.

Another object of this invention is to provide a method of manufacturing semiconductor devices with multilayer wiring structure wherein a part of the insulating layer can be converted into a conductive path by the reduction treatment and the wiring is buried in the insulating layer.

In general, according to this invention, a multilayer wiring structure can be formed by the use of a mixed film usable for both formation of the wiring and insulation. The mixed film in itself has the insulating capability and is convertible into a conductive layer by reduction. The wiring layer in the multilayer wiring structure is formed with a conductive layer converted from the mixed film. The wiring layer is buried in the mixed film. This mixed film basically consists of a metal oxide and a silicon oxide while another oxide such as phosphorus pentoxide can be added to the mixed film. At least the metal of the metal oxide is freed from the mixed film by reduction. This metal forms the above-mentioned conductive layer. Copper, silver, tellurium, thallium, lead, nickel and cadmium are suitable as this metal although copper is the most suitable for use in this invention. The silicon oxide, within the mixed film, keeps the adhesiveness of the mixed film with the conductive layer converted from the mixed film and the insulating film and particularly silicon dioxide protecting the semiconductor substrate. The mixed film can be formed by gaseous phase growth, evaporation, sputtering, painting or segregation. This invention provides the method most suitable for the formation of this mixed film.

The above-mentioned metal complex generally unstable relative to the temperature as it sublimes and readily decomposes at a relatively low temperature. Examples of the metal complex are those obtained by the reaction of metals with acetylacetone, cyclopentadiene, tropolone, aminobutyrate, glassine or aminoazobenzene. A metal complex is decomposed at 300–600° C. in an oxygen atmosphere and the metal is combined with the oxygen to form a metal oxide. In the case where the mixed film is obtained by gaseous phase growth, hydride or halide of silicon and phosphorus can be used as the sources of silicon and phosphorus, respectively. The mixed film can be obtained by thermally decomposing the silicon compound in the oxidizing atmosphere in which the metal complex is decomposed. The composition of this mixture is $MO—SiO_2$ or $MO—SiO_2—P_2O_5$ where M represents metal. This mixture has sufficient insulating capability and is sufficiently dense and can be used satisfactorily as an insulating and protective film in a multilayer wiring. The ratio between the metal and silicon in the mixture can be readily adjusted by varying the ratio of the reaction gases, the treatment time and the temperature. In the above-mentioned gaseous phase reaction treatment, it is also possible to utilize oxygen in an organic silane such as, for example, $Si(OR)_4$ or $(SiR_2)_2O$ (where R is alkyl) which is also the silicon source instead of leading oxygen into the reaction furnace independently. Further, it is also possible to use an oxygen atmosphere containing ozone instead of oxygen as an oxidizing material in the above-mentioned gaseous phase reaction. In this case the temperature of formation of the mixed film can be lowered to 100° C.–400° C. making it possible to avoid a high temperature heat treatment which disadvantageously effects the semiconductor substrate on which the fabrication of semiconductor circuit elements has been completed. The use of the metal complex and the silane is most advantageous for the formation of the mixed film in this invention as it makes it possible to form the oxide at lower temperature.

After the formation of a plurality of circuit elements on the surface of the semiconductor substrate, the formation of an insulating and protective film having electrode windows on the surface of the semiconductor substrate, and the formation of a first mixed film on the semiconductor substrate; the first mixed film is partly reduced to form a first wiring path electrically connected with the circuit elements. This first wiring path either consists of only the metal formed by the reduction or consists of the silicon oxide and the metal formed by the reduction dispersed in said silicon oxide. The first mixed film can be partly reduced to form the first wiring path by heating the substrate in a hydrogen atmosphere, by dipping the substrate in a bath of hydrofluoric acid, hydrochloric acid or sodium thiosulfate or by the photo-sensitive treatment. It must be noted here that the feature of this invention does not reside in this reduction treatment method. The above reduction treatment using hydrogen is advantageously performed at a relatively low temperature of above 200–500° C. considering the influence given to the semiconductor circuit elements. The thickness of the metal layer formed can be varied by controlling the temperature and time of this reduction treatment. The selective reduction treatment can be performed by the use of a suitable mask, i.e. by forming a metal film such as gold, molybdenum or aluminum on the portion of the first mixed film other than the portion to be converted into the first wiring path and then performing the hydrogen reduction. In the case of reduction by dipping of the substrate into a solution of acid or salt in water, photo-resist used in the photoetching technique can be used. In the case of the reduction by the photosensitive treatment, the high screening mask used in the photosensitive treatment of the photoresist can be used. By the reduction treatment as described above, the first wiring path is formed, which is buried in the mixed film constituting an insulating film. Thus it is made possible to greatly reduce the unevenness of the surface of the substrate in the conventional method due to the formation of the first wiring path causing the fault of disconnection or short-circuit.

A second mixed film is then formed on the first mixed film to interconnect a plurality of layers. A second wiring path electrically connected with the first wiring path is then formed on the second mixed film. Multilayer wiring of more than two layers can be formed in the same manner.

Other features and effects of this invention will become more evident from the embodiment of the invention described below.

Figure 2:
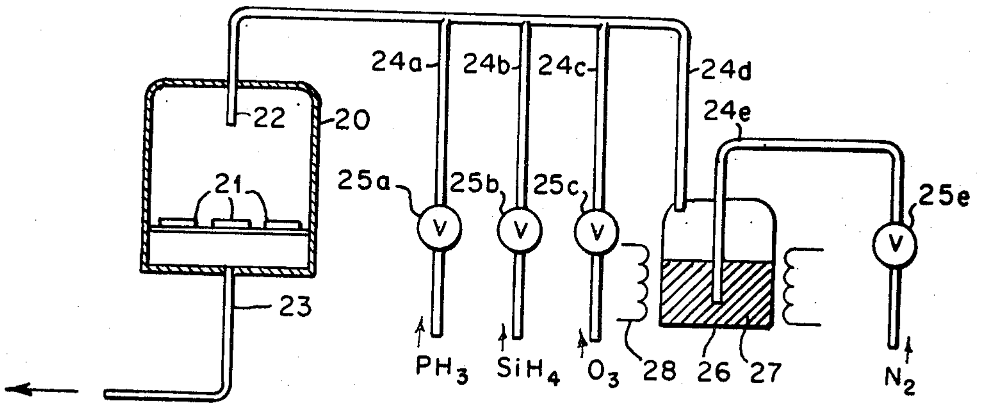
FIG. 2 shows schematically a gaseous phase reaction equipment used for carrying this invention into effect.

Referring now to FIG. 2, semiconductor substrates 21 are placed in reaction vessel 20 such as a bell jar having an inlet 22 for reaction gases and an outlet 23. Phosphine, monosilane and ozone are supplied from sources not shown in the drawing to the reaction vessel 20 through inlet pipes **24–*a*, 24–*b*, 24–*c* provided with values 25–*a* 25–*b*, 25–*c* for controlling the flow rate and flow meters. The nitrogen carrier gas is introduced through pipe 24*e* and is mixed with the vapor of metal complex body 27, in vessel 26. These gases are led through valve 25–*d* and inlet pipe 24–*d* to reaction vessel 20. The metal complex 27 is heated by heater 28** so as to have a suitable vapor pressure. The gaseous phase reaction equipment of FIG. 2 is used for the growth of mixed films in the formation of the multilayer wiring structure in accordance with this invention.

In the present example, phosphine is used as the source of phosphorus and monosilane is used as the source of silicon in the growth of the mixed films. Cupric acetylacetonate, used as the metal complex, has a chemical formula of: $(CH_2COCH_2COCH_3)_2Cu$, a melting point of 230° C. and is volatilized actively above about 180° C. The addition of $P_2O_5$ prevents the movement of sodium ion and achieves the stabilization of the surface of the semiconductor. Heater 28 serves to heat the cupric acetylacetonate to 260° C. and nitrogen flows through at a rate of 1 l./min. The result available by this experiment is as shown in the following table:

TABLE

| Reaction temperature (° C.) | Flow rate of oxygen, l./min. | Reaction time, min. | Thickness of film, angstroms |
|---|---|---|---|
| 480 | 0.2 | 30 | 3,000 |
| 480 | 0.4 | 62 | 5,230 |

When a silicon substrate on which a mixed film of copper silicate glass has been formed is dipped in a 63% solution of hydrofluoric acid in water, copper is precipitate. The adhesiveness of the precipitated copper with the glass film is not very good. No copper is precipitated by dipping the silicon substrate in a diluted hydrofluoric acid obtained by diluting the 63% solution of hydrofluoric acid in water with water of an amount equal to 1/10 of said solution. The reduction treatment can also be performed in two steps, i.e. by firstly dipping the silicon substrate in an undiluted hydrofluoric acid and then heating said silicon substrate in a hydrogen atmosphere. The reduction treatment can also be performed successfully by heating the substrate in hydrogen. The result of an experiment of this treatment is shown in the following table.

TABLE

| Reduction temp. (° C.) | Reduction time, min. | Flow rate of hydrogen, l./min. | Thickness of precipitated copper, A. | Resistivity, Ω·cm. |
|---|---|---|---|---|
| 230 | 6 | 1 | 1,060 | $7.4\times10^{-6}$ |
| 230 | 31 | 1 | 1,195 | $10.8\times10^{-6}$ |

The reduction treatment can be performed in hydrogen in a horizontal type fused quartz pipe, a heater being provided around said quartz pipe and a silicon substrate provided with a mixed film being placed in the heating region of said quartz pipe. In the case of the reduction treatment in hydrogen, the precipitated copper may peel off when the reduction temperature exceeds 380° C. No such fault occurs at a reduction temperature of 230° C. The precipitated copper can be satisfactorily used as the conductor in the multilayer wiring as the resistivity of the precipitated copper is of the order of $10^{-6}$–$10^{-5}$Ω·cm. as shown in the above table.

The formation method and reduction method of the mixed films have been described above. The method of manufacturing semiconductor devices of this invention will now be described with reference to the embodiments of FIGS. 3–5. The invention is not limited to these embodiments.

Figure 3:
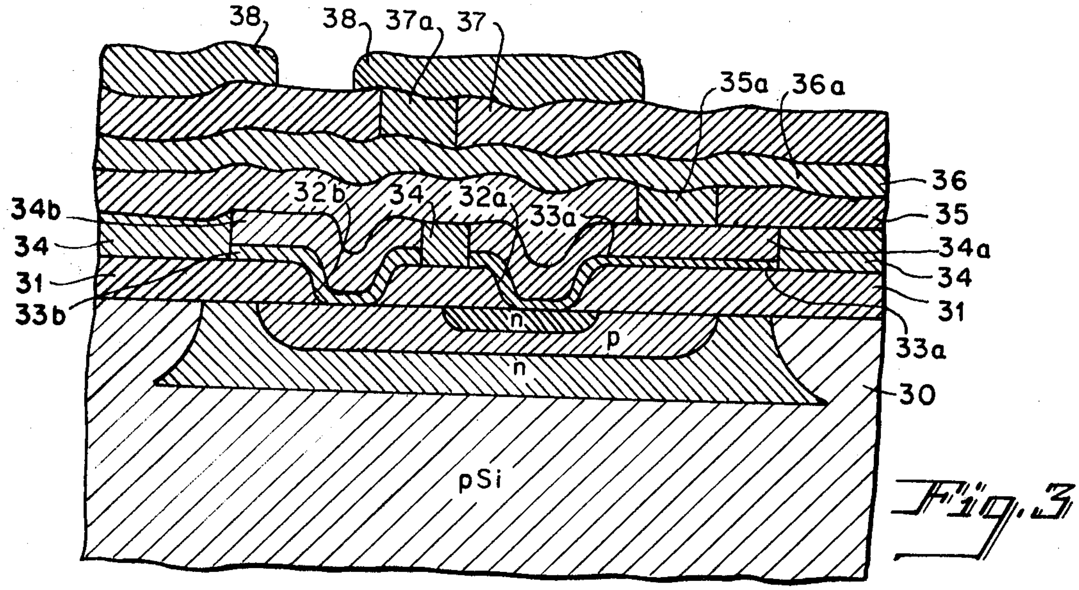
FIGS. 3 to 5 are sectional views of embodiments of the semiconductor device with multilayer wiring structure according to this invention.

FIG. 3 shows a sectional view of a semiconductor integrated circuit with multilayer wiring structure manufactured by only the repetition of the coating of the mixed film and the reduction treatment. A plurality of semiconductor circuit elements are formed on the surface of silicon semiconductor substrate 30 by the well known planar process and this surface is protected by insulating film 31 such as silicon dioxide. The circuit elements must be mutually connected so that the circuit function of an integrated circuit may be exhibited. Windows 32–*a*, and 32–*b*, are opened in the portions of insulating film 31 above the contact areas of a circuit element, and thin ohmic contacts 33–*a* and 33–*b* of aluminum are provided at the windows 32–*a* and 32–*b* respectively. For the sake of simplicity, a single transistor is shown in the drawing as a circuit element. The other similar circuit elements are formed on the surface of the silicon substrate not shown in the drawing; pn junction diodes, semiconductor resistors and Schottky diodes can be used as the circuit elements. The contact areas are within the emitter region and the base region. Other metals can be substituted for the aluminum ohmic contacts and it is also possible to provide the ohmic contacts using platinum silicide. It is also possible to substitute copper precipitated subsequently for ohmic contacts 33–*a*, 33–*b*. The silicon semiconductor integrated circuit substrate provided with ohmic contacts was placed in the gaseous phase reaction equipment of FIG. 2 to effect the gaseous phase reaction treatment. In this treatment, the temperature of the substrate was kept at 450° C. and the temperature of the cupric acetylacetonate was kept at 200° C. By this treatment, copper silicate glass film 34 of a thickness of 8000 angstrom unit was formed on the semiconductor substrate. This mixed film 34 was heated in an oxygen atmosphere to be converted into a CuO—$SiO_2$ film containing a small amount of $P_2O_5$ having a more complete insulating capability. This mixed film 34 is transparent and has a uniform thickness. This mixed film 34 was partly reduced by the reduction treatment in hydrogen to form a first wiring path. A molybdenum film was selected as the mask for the reduction treatment in hydrogen. Molybdenum was deposited to a thickness of 3000 A. on mixed film 34 by vacuum evaporation. The portions of the molybdenum film above the portions of the mixed film 34 to be converted into the first wiring path 34–*a*, 34–*b* were removed by photo-etching. Dilute nitric acid can be used as the etching medium for molybdenum. After the selective etching of molybdenum, the photoresist above the molybdenum is removed and then the mixed film of the thickness of 8000 A. was partly reduced to form wiring pith 34–*a*, 34–*b* by the heating of the silicon substrate in a hydrogen atmosphere at 300° C. for 30 minutes. The wiring path 34–*a*, 34–*b* were then electrically connected with ohmic contact 33–*a*, 33–*b*. After the hydrogen reduction treatment, the molybdenum mask was removed by dipping the substrate into dilute nitric acid.

A second mixed film 35 was grown in the same manner as the coating of the first mixed film 34. Conductive opening 35–*a* was formed by the same reduction treatment as described above. A third mixed film 36 was grown in the same manner as the coating of the first mixed film 34. A second wiring layer 36–*a* was formed by the same reduction treatment as described above. The second wiring layer 36–*a* is above the second mixed film 35 and is electrically connected with the first wiring path through conductive hole 35–*a*. A fourth mixed film 37 was grown in the same manner as the coating of the first mixed film 34. Conductive opening 37–*a* was formed by the same reduction treatment as described above. A metal conductor such as aluminum can be used as wiring path 38 in the top layer as the surface of mixed film 37 has little unevenness. Wiring path 38 can also be formed by the selective reduction of mixed film 37, if necessary.

Figure 4:
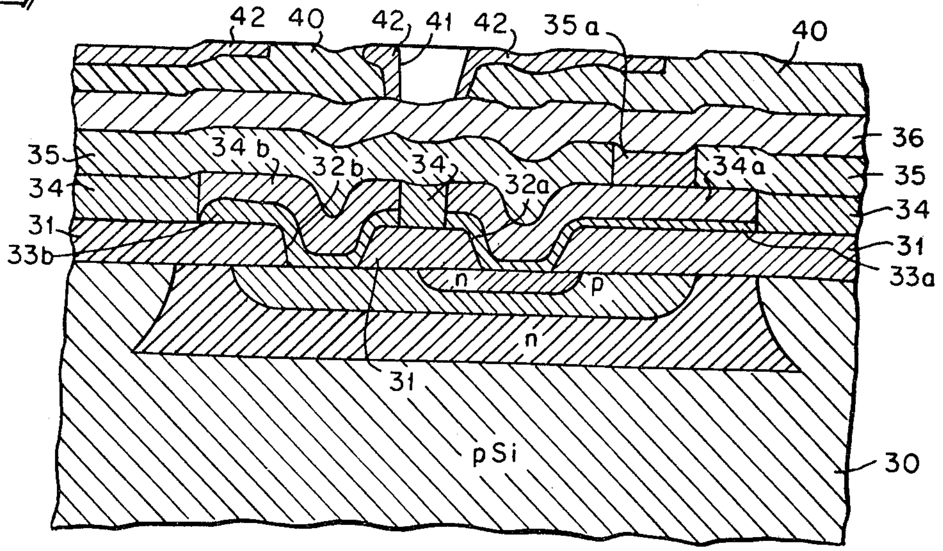

FIG. 4 shows a sectional view of a semiconductor integrated circuit with multilayer wiring structure similar to the semiconductor integrated circuit of FIG. 3. The only difference between the two circuits is that in FIG. 3, the wiring path in the top layer is above the underlying mixed film, whereas in FIG. 4 the wiring path is buried in the mixed film. In FIGS. 3 and 4, like reference numerals refer to like parts. The formation process of layers 31–36 in FIG. 4, is completely the same as that of FIG. 3. Then, in FIG. 4, mixed film 40 is coated on the third mixed film 36 and the portion of the mixed film 40 equivalent to conductive opening 37–*a* of FIG. 3 is removed by the photoetching to form opening 41. Hydrofluoric acid containing a small amount of nitric acid can be used as the etching liquid of the mixed film 40, the silicon oxide is dissolved by hydrofluoric acid and the precipitated copper is dissolved by nitric acid. The mixed film 40 is then reduced to a thickness of about 3000 A., by the selective reduction treatment as described above. Thus wiring path 42 of a pattern equivalent to the pattern of wiring path 38 of FIG. 3 can be formed. The reduction of the mixed film 40 to a certain designated depth can be accomplished by the adjustment of the hydrogen treatment time. The reduction starts from the surface of the mixed film 40 and proceeds toward the inside of the mixed film, so that no disconnection occurs in the opening of the mixed film and the wiring path in the top layer can be electrically connected completely with the wiring paths in the underlying layers.

Figure 5:
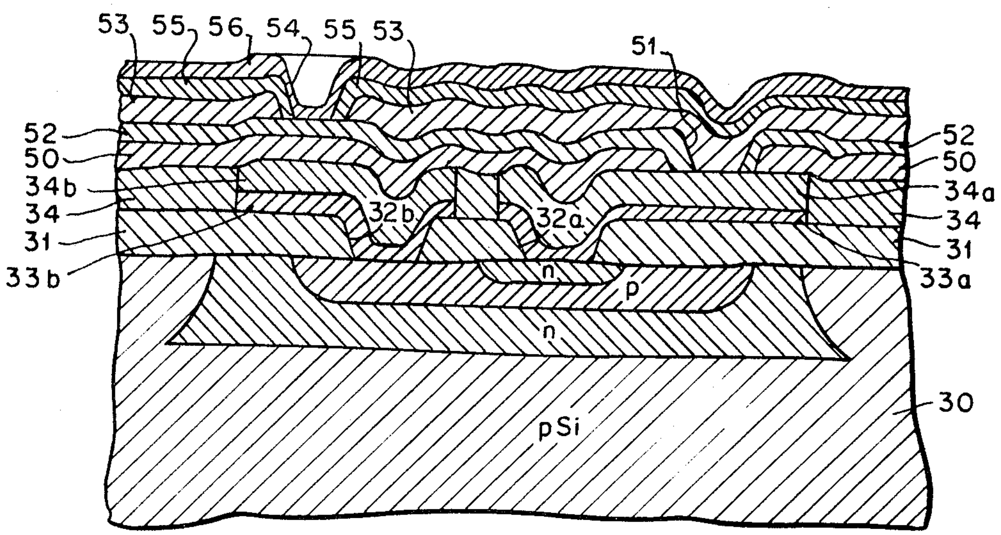

FIG. 5 is a sectional view of a semiconductor integrated circuit with multilayer wiring structure wherein the electric interconnection between a plurality of wiring layers can be achieved by the reduction of mixed films subsequent to the formation of through holes in the mixed films, In FIGS. 4 and 5, like reference numerals refer to like parts. The formation process of layers 31–34 in FIG. 5 was completely the same as that of FIG. 3. Then, FIG. 5, a second mixed film 50 was coated on the first mixed film 34 and then opening 51 was formed in the desired portion of the second mixed film 50 by the photo-etching process identical to that used in the formation of the circuit of FIG. 4. A second wiring path 52 was formed by the selective reduction treatment of the second mixed film 50 by a certain designated period of time. Then, in the same manner as described above, a third mixed film 53 was formed, opening 54 was formed in this film 53, and a third wiring path 55 was formed by the reduction treatment. A high conductivity metal 56 such as aluminum was coated on wiring path 55 in the top layer to improve the conductivity of the wiring where necessary. The method of this example is suited for the reduction of the thickness of the multilayer wiring layers. Although the formation of the opening causes the surface of the multilayer wiring structure to become uneven, such unevenness can be reduced by the burying of the wiring paths in the insulating layers. No disconnection of wirings occurs in the openings as the reduction of the mixed film is started from the surface thereof in the formation of the wirings.

As described above, according to this invention, wiring paths in the multilayer wiring structure are formed in insulating layers and therefore the unevenness of the surface of the multilayer wiring structure can be greatly reduced and faults due to the disconnection or short-circuit of the wirings can be markedly reduced and semiconductor devices with multilayer wiring structure of a high reliability can be manufactured.

We claim:

1. A method of manufacturing semiconductor devices with multilayer wiring structure on a semiconductor substrate containing a plurality of semiconductor circuit elements in the surface portion of said semiconductor substrate, said surface of said semiconductor substrate being protected by an insulating film having electrode windows, which comprises initially depositing a contact metal layer in said electrode windows, forming a first mixed film consisting of a metal oxide and a silicon oxide on said insulating film, reducing said first mixed film to form a first wiring path penetrating through said first mixed film and electrically connected with said semiconductor substrate through said electrode windows, forming a second mixed film consisting of a metal oxide and a silicon oxide on said first mixed film, and forming a second wiring path electrically connected with said first wiring path on said second mixed film.

2. The method of manufacturing semiconductor devices with multilayer wiring structure as in claim 1, wherein said mixed films are coated on said semiconductor substrate by the gaseous phase decomposition of a metal complex and a silane in an oxgen atmosphere.

3. The method of manufacturing semiconductor devices with multilayer wiring structure as in claim 1, wherein said mixed films are coated on said semiconductor substrate by the gaseous phase decomposition of a metal complex and a silane in an oxygen atmosphere containing ozone.

4. The method of manufacturing semiconductor devices with multilayer wiring structure as in claim 1, wherein the metal constituting the metal complex is one of copper, silver, tellurium, thallium, lead, nickel and cadmium.

5. The method of manufacturing semiconductor devices with multilayer wiring structure as in claim 1, wherein phosphorus pentoxide is added into said mixed films.

6. The method of manufacturing semiconductor devices with multilayer wiring structure as in claim 1, wherein said mixed films are coated on said semiconductor substrate by the gaseous phase decomposition of cupric acetylacetonate, monosilane and phosphine in an oxygen atmosphere containing ozone.

7. The method of manufacturing semiconductor devices with multilayer wiring structure, as in claim 1, wherein said wiring paths are formed by the reduction treatment in hydrogen by the use of metal masks.

8. The method of manufacturing semiconductor devices with multilayer wiring structure, as in claim 1, wherein said second wiring path is formed on said second mixed film by the reduction of said second mixed film subsequent to the exposing of a part of said first wiring path by the opening of a window, in said second mixed film.

References Cited

UNITED STATES PATENTS

| | | | |
|---|---|---|---|
| 3,395,040 | 7/1968 | Pritchard, Jr., et al. | 117—212 |
| 3,515,686 | 6/1970 | Bowman | 252—518 X |
| 3,386,894 | 6/1968 | Steppat | 117—212 X |

ALFRED L. LEAVITT, Primary Examiner

K. P. GLYNN, Assistant Examiner

U.S. Cl. X.R.

29—590, 591; 117—217; 252—518